(12) United States Patent
Kucharski et al.

(10) Patent No.: US 7,098,697 B2
(45) Date of Patent: Aug. 29, 2006

(54) LOW VOLTAGE HIGH-SPEED DIFFERENTIAL LOGIC DEVICES AND METHOD OF USE THEREOF

(75) Inventors: Daniel Kucharski, Ithaca, NY (US); Kevin Kornegay, Ithaca, NY (US)

(73) Assignee: Cornell Research Foundation Inc., Ithaca, NY (US)

( * ) Notice: Subject to any disclaimer, the term of this patent is extended or adjusted under 35 U.S.C. 154(b) by 0 days.

(21) Appl. No.: 10/857,238

(22) Filed: May 28, 2004

(65) Prior Publication Data

US 2005/0264319 A1 Dec. 1, 2005

(51) Int. Cl.
*H03K 19/086* (2006.01)
(52) U.S. Cl. ......... 326/126; 326/127; 326/115
(58) Field of Classification Search ......... 326/104, 326/115, 126–127, 52–55
See application file for complete search history.

(56) References Cited

U.S. PATENT DOCUMENTS

| | | | | |
|---|---|---|---|---|
| 5,424,660 A | * | 6/1995 | Scott et al. | 326/126 |
| 5,514,984 A | * | 5/1996 | Nakamura | 326/126 |
| 5,602,498 A | * | 2/1997 | Satoh et al. | 326/126 |

FOREIGN PATENT DOCUMENTS

| | | |
|---|---|---|
| EP | 93309003.7 | 6/1994 |
| JP | 01039117 A | 2/1989 |

OTHER PUBLICATIONS

BiCMOS 7HP, http://www-306.ibm.com/chips/techlib/techlib.nsf/products/BiCMOS_7HP, no date.
Foundry Technologies 180—nm CMOS, RF CMOS and SiGe BiCMOS, http://www-306.ibm.com/chips/techlib/techlib.nsf/techdocs/FE154539B8C4C01687256C . . . , no date.
High-performance devices for a wide range of applications: Foundry technologies 180-nm CMOS, RF CMOS and SiGe BiCMOS, 4 pp., Copyright IBM Corporation 2004, no month.
The MOSIS Service: An Integrated Circuit Fabrication Service, 2 pp., http://www.mosis.org/products/fab/vendors/ibm/7hp/, no date.
International Search Report Dated Nov. 15, 2005.
Kucharski, Daniel, et al., "A 40GHz 2.1V Static Frequency Divider in SiGe Using Low-Voltage Latch Topology," pp. 461-464, 2005 IEEE, Radio Frequency Integrated Circuits Symposium.
Kucharski, Daniel, et al., "A 43-45Gb/s 2.5V Integrated Clock and Data Recovery Circuit in SiGe Using Low-Voltage Topologies," pp. 86-88, 2005 IEEE, BCTM 6.1.
Kucharski, Daniel, et al., "A 40Gb/s 2.5V $2^7$-1 PRBS Generator in SiGe Using a Low-Voltage Logic Family," pp. 340-342, 2005 IEEE, International Solid State Circuits Conference.
Razavi, Behzad et al. Design Techniques for Low-Voltage High-Speed Digital Bipolar Circuits, pp. 332-339, 1994 IEEE, Journal of Solid State Circuits.

* cited by examiner

*Primary Examiner*—Anh Q. Tran
(74) *Attorney, Agent, or Firm*—Wall Marjama & Bilinski LLP

(57) ABSTRACT

A circuit topology for high speed low voltage logic circuits is disclosed that reduces the number of levels of stacked active circuit elements from 3 to 2. Circuits providing a variety of logic functions are presented, including a latch, an exclusive OR gate, a combination XOR and latch, a multiplexer and a demultiplexer. Circuits built according to the principles of the invention have been operated at speeds of 40 GHz. The circuit topology can operate at supply voltages as low as 2V (for silicon or silicon-germanium based devices) and provide power saving of 25%–50% or more, depending on the logic function. In some embodiments, circuits comprising single ended or differential inputs can be provided.

16 Claims, 11 Drawing Sheets

LOW VOLTAGE HIGH-SPEED DIFFERENTIAL LOGIC DEVICES AND METHOD OF USE THEREOF

CROSS-REFERENCE TO RELATED APPLICATIONS

This application is related to co-pending U.S. patent application Ser. No. 10/857,582, entitled "Extended Bandwidth Amplifier and Oscillator Using Positive Current Feedback Through Inductive Load," filed contemporaneously herewith on May 28, 2004, which application is subject to assignment to the same assignee as this application, and which application is incorporated herein by reference in its entirety.

FIELD OF THE INVENTION

The invention is generally related to logic circuits and more specifically to a family of novel high-speed low-voltage logic gates.

BACKGROUND OF THE INVENTION

Currently, some of the fastest digital circuits, particularly those used in multi-Gigabyte/second (multi-Gb/s) data communication systems and test equipment applications, are implemented using current mode logic (hereinafter "CML"). CML requires bias voltages of about 3.3V–5V to provide a satisfactory level of performance.

While very high speed operation in desirable, it is also recognized that circuits operating at higher voltages dissipate greater amounts of power than do circuits operating at lower voltages. In the course of their operation, circuits generate heat that is proportional to their power consumption. This heat needs to be dissipated using a combination of heat sinks, convection, forced air, and liquid cooling. Since power is proportional to the product of voltage and current (P=IV), reducing the power supply voltage, or reducing a reference voltage difference, leads to a corresponding reduction in heat. The heat issue is of particular importance in systems featuring very high circuit density, such as microprocessors and multi-channel communication systems, and has been recognized by the industry as one of the major obstacles for the future advances of the information technology. Additionally, semiconductor technology scaling leads to continued reduction in power supply voltages, and implementing selected high speed circuit components which require high voltages and dedicated power supplies complicates the power distribution problem, and it requires more "real estate" at both the chip and the board level. Accordingly, there is a need for circuits that can attain very high switching speeds, but which offer better power dissipation and reduced size by requiring smaller reference voltage differences, or colloquially, lower voltage of operation (relative to ground).

SUMMARY OF THE INVENTION

The logic gates described hereinbelow, both as to their topology and method of operation, provide exemplary solutions to the problem of building high speed logic gates that operate at low reference voltage difference as compared to CML. In one embodiment, the topology of logic gates according to the principles of the invention reduces current logic device stacking from 3 levels to 2 levels while achieving speeds of operation matching that of CML. The novel circuit topology can operate at supply reference voltage differences at least as low as 2V (for silicon or silicon-germanium based devices) and provide power saving of 25%–50% or more, depending on the logic function, relative to CML. All gates according to principles of the invention share certain topological features. The gates feature single-level differential pairs that can be connected in parallel, but are never stacked. The differential pairs drive emitter followers, which can be connected in parallel or switched on and off. Consequently, every logic operation is initiated in the current domain using differential pairs and completed in the voltage domain using emitter followers. This is different from CML topology, which performs the entire logic operation in the current domain, by steering current in stacked differential pairs. The implementation details for several exemplary embodiments of logic gates including latch, XOR, MUX, DEMUX, and their combinations are presented hereinbelow.

In one aspect, the invention relates to an active circuit logic device configured to operate at a reduced reference voltage difference. The active circuit logic element comprises a first level comprising at least one current source, the at least one current source having a first terminal in electrical communication with a first reference voltage, and a second terminal; a second level comprising at least one pair of active circuit elements configured to perform a logic operation by steering a current, each member of the pair of active circuit elements having a signal input terminal, each member of the pair of active circuit elements having a terminal in electrical communication with a selected one of the second terminal of the at least one current source, each member of the pair of active circuit elements having a third terminal; and an output subcircuit configured to operate using logic represented by a voltage, the output subcircuit having at least one signal output terminal, the output subcircuit having a first terminal in electrical communication with a selected one of the third terminal of the member of the at least one pair of active circuit elements of the second level to receive at the first terminal a current provided by the member of the at least one pair of active circuit elements of the second level, and a second terminal in electrical communication with a second reference voltage. The active circuit logic device is configured to operate at a reduced reference voltage difference relative to a logic gate fabricated in the same electronic material according to the conventional three level CML topology and providing the same functionality.

In one embodiment, the electronic material comprises SiGe. In one embodiment, the reference voltage difference represents a difference between the first reference voltage and the second reference voltage. In one embodiment, the reference voltage difference is less than 3.3 volts. In one embodiment, the reference voltage difference is 2.0 volts. In one embodiment, the reference voltage difference is 1.8 volts. In one embodiment, the reference voltage difference is 1.2 volts.

In different embodiments, the active circuit logic device comprises a latch, an Exclusive OR logic gate, a multiplexer, or a demultiplexer. In one embodiment, the first level comprising at least one current source comprises a passive circuit element. In one embodiment, the first level comprises at least one current source comprises an active circuit element. In one embodiment, the active circuit element comprises more than one active element in electrical communication in a cascode topology. In one embodiment, the at least one current source comprises a substantially constant current source. In one embodiment, a selected one of the first reference voltage and the second reference voltage is ground potential and the other of the first reference voltage and the second reference voltage is a power supply voltage referenced to ground. In one embodiment, a voltage difference between the first reference voltage and the second reference voltage is equal to a power supply voltage referenced to ground. In one embodiment, the active circuit logic device comprises a single ended input. In one embodiment, the output subcircuit comprises a load element. In one embodiment, the output subcircuit comprises an emitter follower.

In one aspect, the invention features a method of operating an active circuit logic device configured to operate at a reduced reference voltage difference. The method comprises the steps of providing a current source having a first terminal in electrical communication with a first reference voltage, and a second terminal, the current source providing a current; providing at least one pair of active circuit elements configured to perform a logic operation by steering a current, each member of the pair of active circuit elements having a signal input terminal, each member of the pair of active circuit elements having a terminal in electrical communication with a selected one of the second terminal of the at least one current source, each member of the pair of active circuit elements having a third terminal; providing an output subcircuit configured to operate using logic represented by a voltage, the output subcircuit having at least one signal output terminal, the output subcircuit having a first terminal in electrical communication with a selected one of the third terminal of the member of the at least one pair of active circuit elements of the second level to receive at the first terminal a current provided by the member of the at least one pair of active circuit elements of the second level, and a second terminal in electrical communication with a second reference voltage; providing a first reference voltage and a second reference voltage, a difference between the first reference voltage and a second reference voltage being smaller than a reference voltage difference required for the proper operation of a logic gate fabricated in the same electronic material according to the conventional three level CML topology and providing the same functionality; providing at least one differential pair of input logic signals, each signal of the pair of differential input logic signals being applied to a respective one of the signal input terminals of the at least one pair of active circuit elements configured to perform a logic operation by steering a current; and receiving from the at least one signal output terminal of the output subcircuit a signal representing a result logically related to the at least one differential pair of input logic signals. In one embodiment, at least one pair of the at least one differential pair of input logic signals are generated using a single ended input circuit.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION OF THE INVENTION

Figure 1:
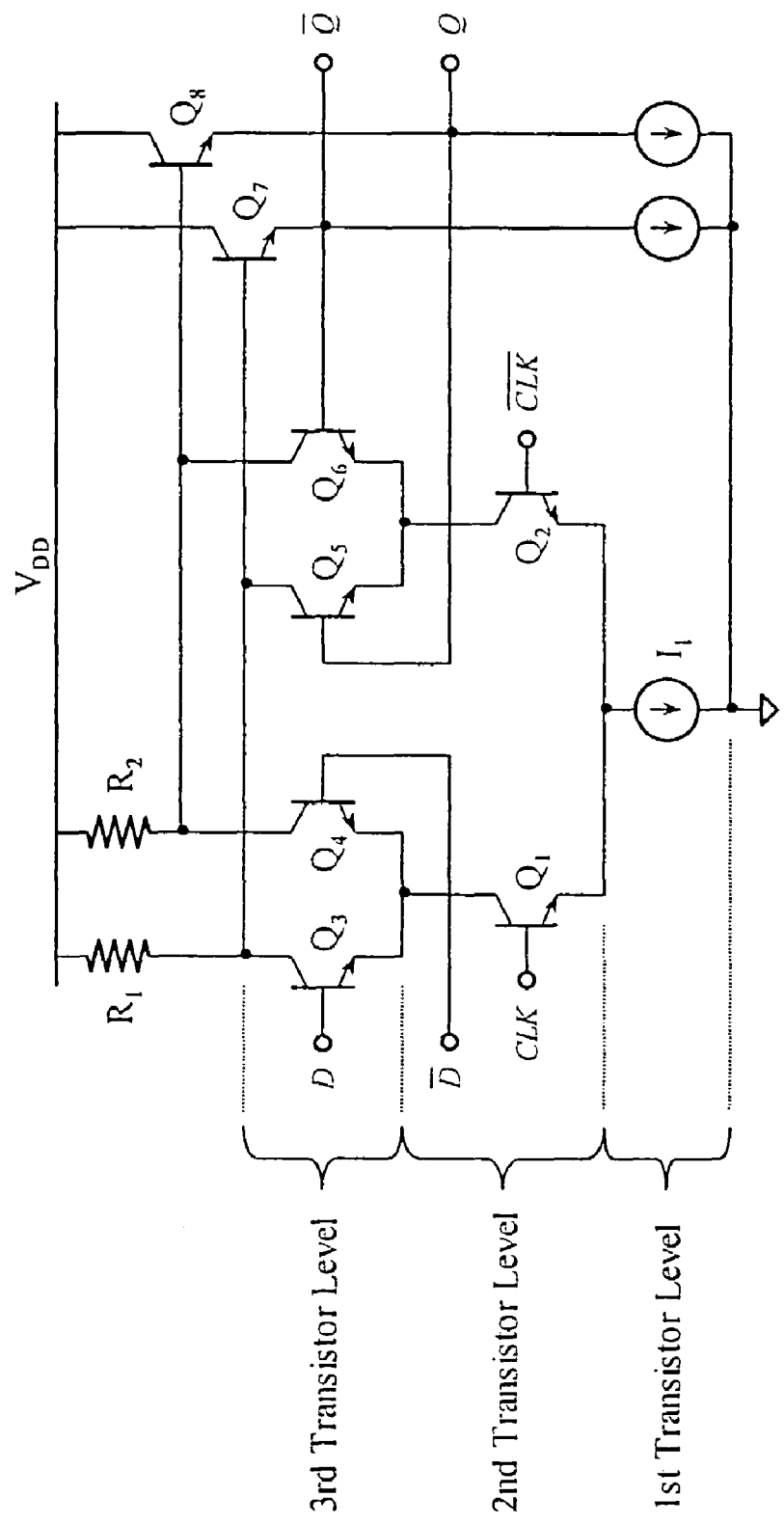
FIG. 1 is a schematic diagram showing a circuit of the prior art that exhibits traditional CML latch topology.

CML is based on stacked differential pairs, as shown in the example of a prior art latch circuit 100 presented in FIG. 1. In conventional CML circuitry, a stack of 3 current logic devices (or as indicated in FIG. 1, 3 levels of circuit elements that control currents, including a level of current source elements and two levels of current steering elements) is required to implement functions such as a latch, an AND gate, an exclusive OR (XOR) gate, or a multiplexer (MUX). An output section is provided to convert the currents provided by levels 1–3 as described above to voltage signals that appear at one or more output terminals. Every device in the stack requires a sufficient voltage across its terminals to achieve high switching speed. Therefore, the total voltage required to operate the CML logic gate is at least as large as the sum of three voltage differences, where each level requires a minimum voltage difference to be applied thereacross for proper operation. As already indicated, typical reference voltage difference requirements for such circuits are in the range of 3.3 to 5 volts. Although the circuit depicted in FIG. 1 also has at its right side stacks that appear to represent two levels of circuit elements, those levels are supplied with the same voltage difference that is required for the operation of the three current logic level circuitry on the left of FIG. 1, and therefore do not represent a circuit topology that is in conformity with the inventive concept as described and claimed herein having a reduced voltage difference between reference voltages. In addition, the purpose of the stacks at the right side of FIG. 1 is output buffering and level shifting as opposed to implementing a logic function. These circuit elements are configured as emitter followers, whose output terminals are shifted towards the lower reference voltage by a value of $V_{BE}$.

Figure 1A:
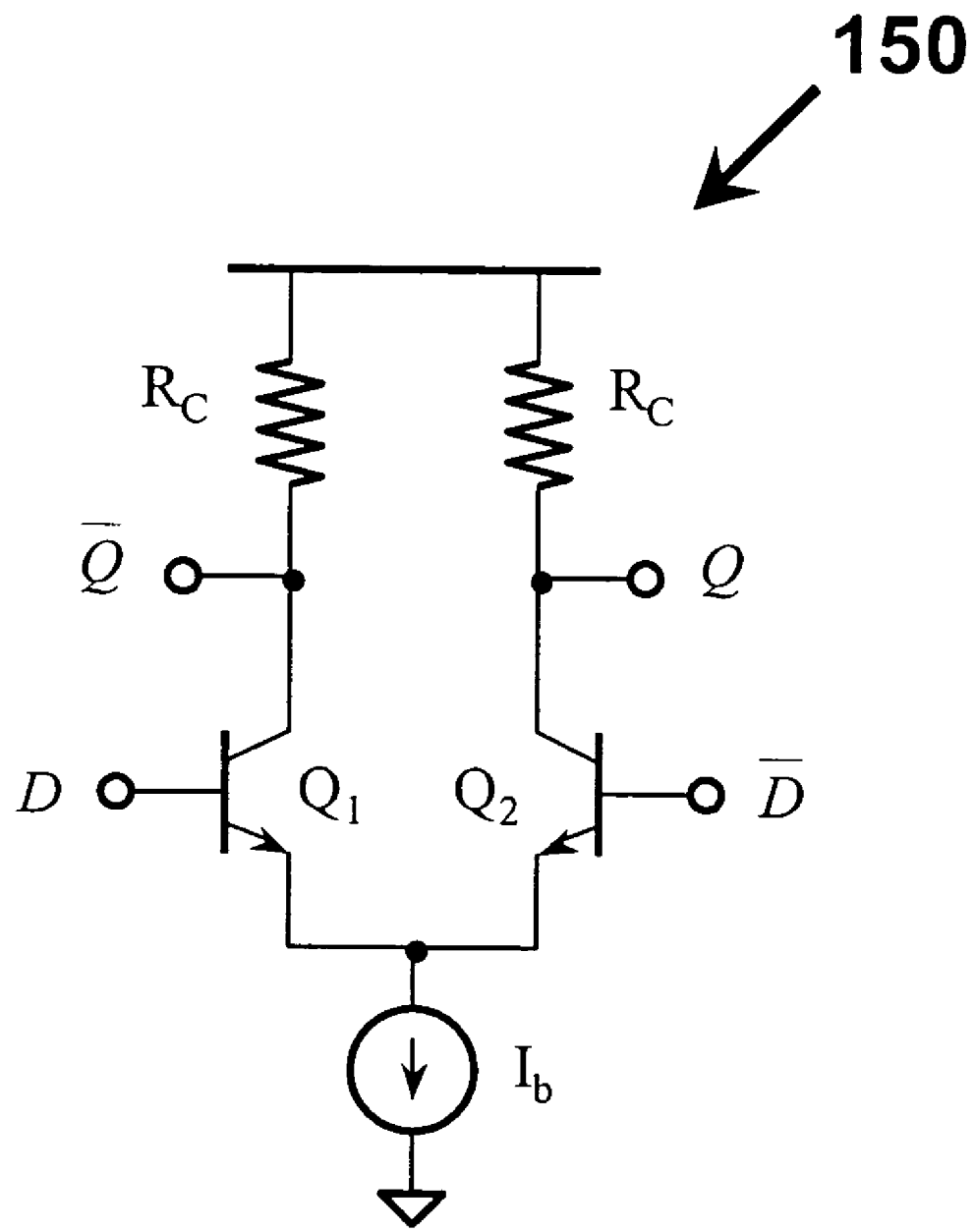
FIG. 1A is a schematic diagram showing a prior art inverter circuit that is useful in traditional CML circuit topology.

FIG. 1A is a schematic diagram showing a prior art inverter circuit 150 that is useful in traditional CML circuit topology. The inverter 150 is the simplest possible CML circuit element. The inverter circuit 150 operates from reference voltage sources providing power having voltage potentials $V_{DD}$ and ground, corresponding to the typical CML voltage requirements in the range of 3.3 to 5 volts. The inverter 150 comprises differential inputs D and bar D, and provides differential outputs Q and bar Q. In general, a symbol and its bar (for example, SIGNAL and bar SIGNAL) are understood to be logically complementary, that is, when SIGNAL is high, the value of bar SIGNAL is low, and when SIGNAL is low, the value of bar SIGNAL is high. The signal input and output values (e.g., high and low voltages used to represent inputs and outputs) for the CML inverter 150 need to be compatible with the signal input and output values of other CML circuit elements, such as those in FIG. 1. Therefore, the inverter 150 intended for use in CML circuitry cannot be understood to operate at a reduced reference voltage difference relative to the reference voltage difference for the remainder of a CML circuit, because operation of the inverter 150 at such a reduced voltage difference would result in incorrect input and output signal levels, and incorrect operation of the CML circuit as a whole.

As employed in this application, a tail current source is treated as a single functional level, but the actual internal topology of the current source does not matter. A suitable current source can comprise a single transistor, or a stack of two or more transistors, such as in cascode current sources (including double, triple, or higher order cascode), a Wilson topology, or other known topologies for current sources. In addition, a current source can include a combination of active and passive devices, with resistors being used to improve output impedance. In fact, even a single resistor can be used as a simple current source with fixed output impedance R. All these current sources can be used equally well in CML topologies, so no matter how the counting is done, the logic family disclosed and claimed herein requires 1 fewer level in the stack. All other things being equal, the logic family disclosed and claimed herein will always operate from a lower supply voltage than will the same functionality in a CML embodiment.

For the purposes of the present discussion, an emitter follower is not counted as a part of the transistor stack, because it is used to achieve a level shift toward the lower reference voltage (ground) and away from the higher reference voltage ($V_{DD}$) by a value of at least $V_{BE}$. Thus the output of the emitter follower (emitter terminal) is at a lower potential than its input (base terminal), and it does not increase the voltage headroom requirement of the overall circuit.

One motivation for the invention is to reduce the required applied voltage. By reducing the number of levels in the stack of logic circuit devices or components from 3 levels to 2 levels, the reference voltage difference required to operate the two level stack can be reduced to any value within a range that has as its upper limit a reference voltage with respect to ground that is just below the minimum voltage difference required to reliably operate a three level stage to a lower limit defined by a reference voltage difference just sufficient to reliably operate a two level stack.

In contrast, circuits designed and operating according to principles of the invention include high-speed low-voltage logic gates having two levels of circuitry. As illustrative examples of such circuits, a latch, an XOR gate, a MUX, and a demultiplexer (DEMUX) are described herein. The invention includes such embodiments and others, and combinations of these gates. Circuit designs according to principles of the invention provide devices that operate at speed up to at least 40 gigahertz (GHz) using low voltage supplies, the reference voltage differences being 3.3 volts or less. For example, designs are possible that can operate at reference voltage difference of 3.2, 3.1, 3.0, 2.9, 2.8, 2.7, 2.6, 2.5, 2.4, 2.3, 2.2, 2.1, 2.0, 1.9, 1.8, 1.7, 1.6, 1.5, 1.4, 1.3, and 1.2 volts. It is expected that future advances, including reductions in feature size, and use of improved electronic materials, dielectrics and metallizations (or other conductive media) and improved process control will allow operation of circuits according to the invention at reference voltage differences as low as 1.0 volts, and possible less than 1.0 volts.

Figure 2:
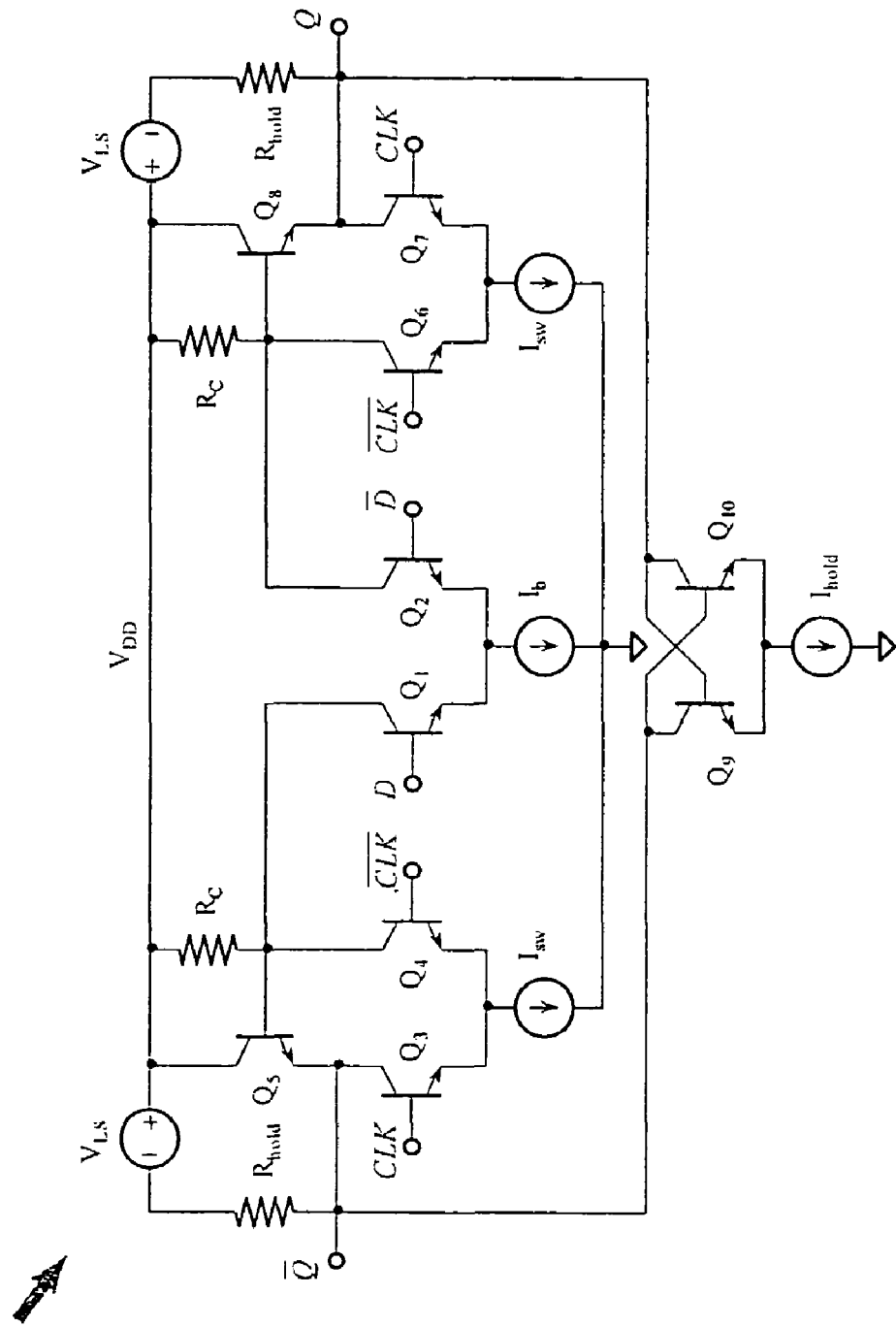
FIG. 2 is a schematic diagram that illustrates an exemplary embodiment of a latch circuit employing switched emitter follower topology, according to principles of the invention.
Figure 2A:
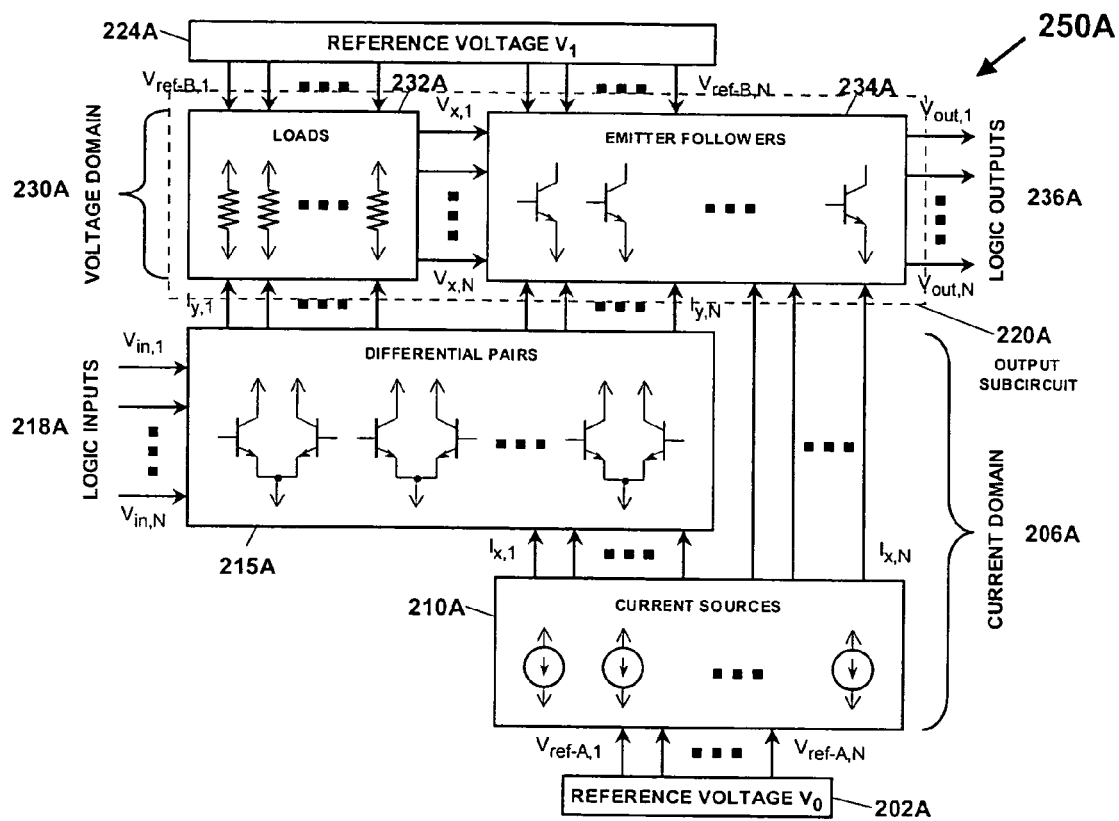
FIG. 2A is a schematic diagram that illustrates in a generalized manner the topological features of low voltage logic circuits, according to principles of the invention.

FIG. 2A is a schematic diagram 250A that illustrates in a generalized manner the topological features of low voltage logic circuits of the invention. While a particular sequence of components in levels is outlined with regard to FIG. 2A, the same logic function can be implemented using positive logic or negative logic, and accordingly, equivalent logic that may be represented by a circuit having a different sequence of elements as one moves through a diagram like that of FIG. 2 from one voltage reference to the other voltage reference. The circuits according to principles of the invention in general operate using two voltage sources 202A, 224A, operating at reference voltage $V_0$ and reference voltage $V_1$, respectively. The magnitude of the voltage difference between the reference voltages, $\Delta V$=absolute magnitude of $(V_1-V_0)$, will be less than the corresponding magnitude of voltage difference needed to operate the corresponding logic function gate fabricated using the conventional CML topology in the same electronic material (or a material having substantially the same bandgap).

In FIG. 2A, the signals are identified as either voltages (V) or currents (I), and the sequence of logic operations (or equivalently, the signal flow) is indicated by arrows. As illustrated schematically in FIG. 2A, a first level comprises at least one current source 210A has one terminal in electrical communication with the reference voltage $V_0$, and receives a voltage signal indicated by an arrow labeled $V_{ref-A,1}$ therefrom. In one embodiment, the at least one current source is a constant current source. In other embodiments, the at least one current source can be a variable or adjustable source. In still other embodiments, some current sources can be constant current sources, and other current sources can be variable or adjustable current sources. The current source has a second terminal in electrical communication with at least one pair of active circuit elements 215A operating as a differential pair, as indicated by an arrow labeled $I_{x,1}$ from 210A to 215A.

The at least one pair of active circuit elements 215A represent a second level of logic elements that accept external logic inputs and perform logic operations in the current domain by using current steering. In some embodiments, a plurality of differential pairs can be connected in parallel within this level. There are at least two logic inputs 218A to the at least one pair of active circuit elements 215A, indicated by the arrows labeled $V_{in,1} \ldots V_{in,N}$.

The differential pairs 215A steer current represented by arrows $I_{y,1} \ldots I_{y,N}$ to an output subcircuit 220A. The outputs of the second level of logic elements are currents that can be directed either to the loads (e.g. $I_{y,1}$), where the currents are converted to voltages, or to the emitter follower block (e.g., $I_{y,N}$), where the output currents are used to accomplish the "on" and "off" (high-Z) switched emitter follower operation. The diagram 250A is a general description, and covers both switched emitter followers as well as parallel emitter followers used for peak detection (also referred to as a "maximum operation").

The output subcircuit 220A converts at least one current input $I_{y,1}$ to at least one logic output 236A (e.g., $V_{out,1}$), and the output subcircuit 220A is a voltage domain 230A logic element, in that it converts a current input into a voltage output. In one embodiment, the output circuit 220A comprises one or more loads 232A and one or more emitter followers 234A. The output subcircuit 220A is in electrical communication with a reference voltage source $V_1$ as indicated by arrow $V_{ref-B,1}$.

The schematic diagram 250A is useful in differentiating between the logic family of the present invention and conventional CML. Conventional CML as shown in FIG. 1 requires a second differential pair level (level 3) stacked on top of the first differential pair level (level 2). CML also makes use of an output subcircuit similar to subcircuit 220A to convert currents to voltages and emitter followers for level shifting and buffering. CML therefore always requires more voltage headroom (e.g., higher applied voltage difference) due to the addition of level 3.

Turning to FIG. 2, an illustrative embodiment of a latch circuit 200 employing switched emitter follower topology is presented and described. The circuit of FIG. 2 reduces the levels of devices in a stack from 3 to 2 while achieving speed of operation matching that of a CML latch. The lower level of the stack comprises several current sources $I_{SW}$ and $I_b$. The current sources have one terminal in electrical communication with a reference voltage, namely ground potential in the embodiment depicted in FIG. 2. Each current source has a second terminal in electrical communication with a terminal of an active circuit element of a second level of the latch topology. The second level comprises one pair of active circuit elements $Q_1$, $Q_2$ configured to operate using logic represented by a voltage. The active circuit elements $Q_1$, $Q_2$ have two signal input terminals D and bar D, and two signal output terminals indicated by Q and bar Q. The active circuit elements $Q_1$, $Q_2$ are in electrical communication with the second reference voltage $V_{DD}$ by way of resistors $R_C$.

In the circuit depicted in FIG. 2, all inputs and outputs are differential. Input D is applied to a differential amplifier consisting of transistors $Q_1$ and $Q_2$ with resistive loads $R_C$. When a clock (CLK) input is high, tail currents $I_{sw}$ flow through transistors $Q_3$ and $Q_7$. Transistors $Q_5$ and $Q_8$ operate as emitter followers, transmitting the signal from the collectors of $Q_1$ and $Q_2$ to the outputs Q and bar Q. The latch is transparent in this state. This is the track or capture mode. When CLK is low, $Q_4$ and $Q_6$ conduct all of the currents $I_{sw}$, which flow through resistors $R_C$ pulling down the bases of $Q_5$ and $Q_8$. Thus $Q_3$, $Q_5$, $Q_7$, and $Q_8$ turn off, disconnecting the output nodes from the input. The latch enters the hold mode, in which the output levels are maintained by a cross-coupled differential pair $Q_9$ and $Q_{10}$, which is biased at a low holding current $I_{hold}$.

The switched emitter follower is a known analog sampling circuit, which is typically used at the front end of analog-to-digital converters. However, its track-and-hold operation can be adapted to create a digital storage element, for example if it is used with a circuit that operates in binary fashion (e.g., having one of two defined states at any time, such as high or low, on or off, one or zero). The switched emitter follower topology has potential applications in a variety of high speed digital and mixed-signal circuits, including but not limited to shift registers, pseudo-random binary sequence (PRBS) generators, frequency dividers, and state machines.

Values for $I_{hold}$, for a level shift voltage source $V_{LS}$, and for resistance $R_{hold}$ need to be chosen such that the outputs levels in the hold mode match the levels in the capture mode. To assure correct operation of this circuit the following conditions should be satisfied: $I_{sw} > I_b$, and $I_{sw} >> I_{hold}$. Satisfaction of the first condition assures that $Q_5$ and $Q_8$ turn off completely in the hold mode, without regard for the magnitude of the input signal. Satisfaction of the second condition assures that the emitter followers formed by devices $Q_5$ and $Q_8$ will overcome the cross-coupled pair $Q_9$ and $Q_{10}$, and assert the control of the output nodes Q, bar Q, in the capture mode. If the clock speed is fixed, the cross-coupled pair $Q_9$ and $Q_{10}$ can be replaced by capacitors. Proper capacitor sizing can provide minimal droop during hold phase. The schematic in FIG. 2 shows an embodiment constructed with BJT devices, but this circuit can be implemented using FETs, or any other type of transistor. Current sources can be replaced with resistors to further reduce voltage headroom requirement. A single-ended variant of this latch is also possible. Two latches can be cascaded to create a flip-flop.

Figure 3:
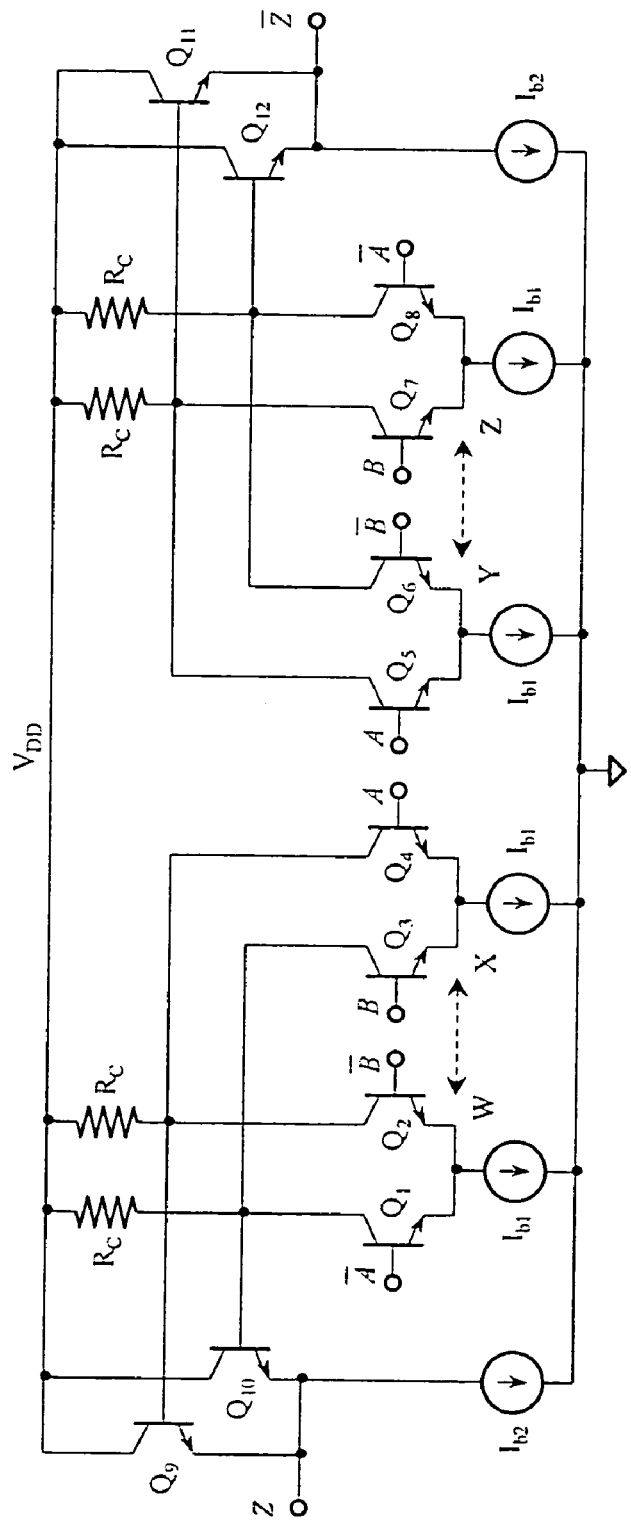
FIG. 3 is a schematic diagram that illustrates an exemplary embodiment of an XOR topology, according to principles of the invention.

FIG. 3 is a schematic diagram of an illustrative embodiment of an XOR gate topology 300 according to principles of the invention. The operation of the XOR gate is based on common mode rejection in differential amplifiers, followed by waveform rectification using parallel emitter followers. Inputs A, B, and output Z are differential. A differential amplifier with a good common mode rejection produces approximately the same output voltage when both inputs are high and when both inputs are low. In both cases, the tail current is divided equally between the two branches of the differential amplifier.

As is required by the truth table for an XOR gate, only inputs with a differential component cause the amplifier to switch. Thus, logic inputs corresponding to the states AB=11 (e.g., A=1 and B=1, where "1" represents high logic level, and "0" represents logic low) and AB=00 do not cause tail current $I_{b1}$ of differential pairs $Q_1$–$Q_4$ to switch. On the other hand, logic inputs corresponding to the states AB=01 and AB=10 do cause current switching. The opposite holds true for differential pairs $Q_5$–$Q_8$, resulting in complementary outputs. The differential pair currents are converted to voltages by passing through collector loads $R_C$, and are rectified by a pair of differential peak detectors $Q_9$–$Q_{10}$ and $Q_{11}$–$Q_{12}$. The circuit in FIG. 3 is fully differential. However, a simpler single-ended version is also possible with this approach by using only one half of the circuit ($Q_1$–$Q_4$ and $Q_9$–$Q_{10}$). In FIG. 3, the dotted arrows indicate that nodes W and X as well as nodes Y and Z can be connected together and two current sources $I_{b1}$ can be combined on each side with no change in functionality.

Figure 4:
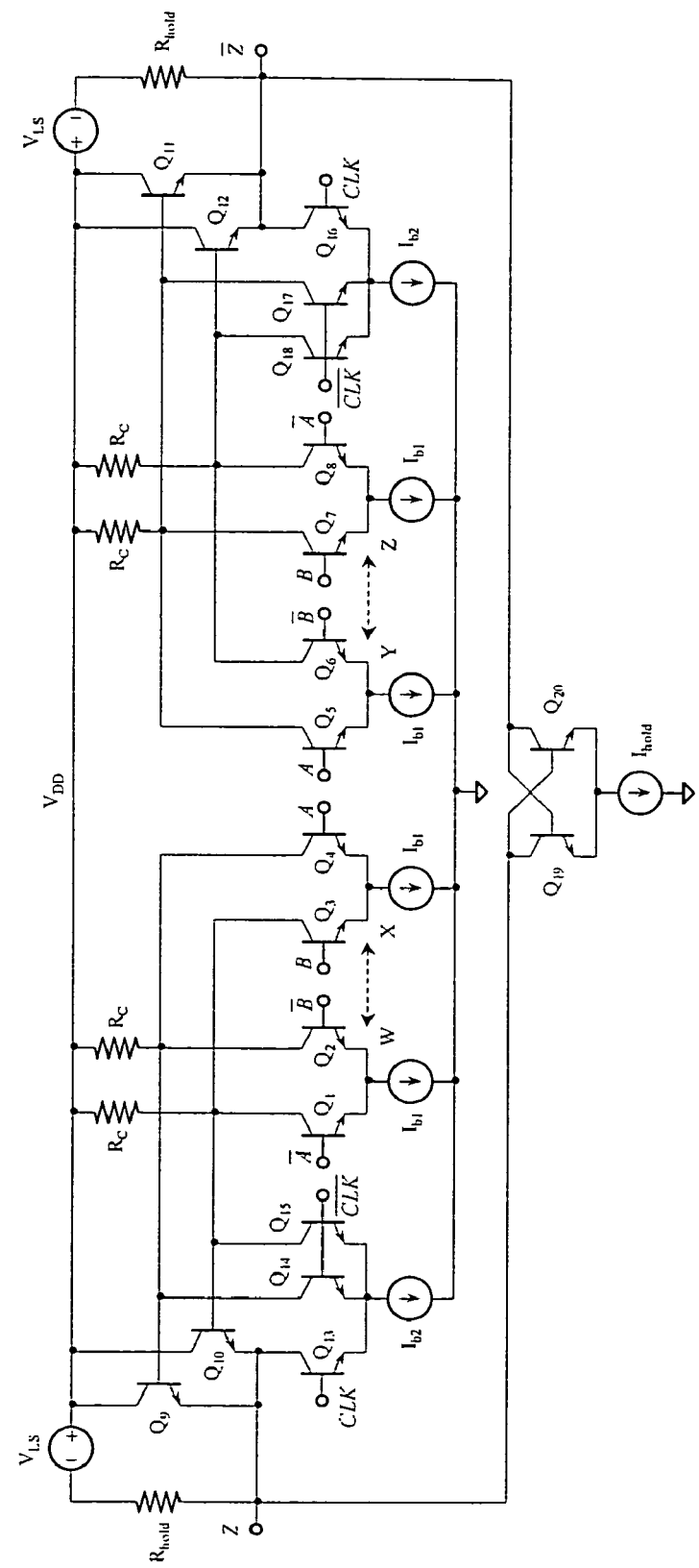
FIG. 4 is a schematic diagram of an illustrative embodiment of an implementation of an XOR-latch combination, according to principles of the invention.

The latch topology can be adapted to perform Boolean operations such as XOR without increasing the number of logic levels. This creates a synchronous logic gate with a delay comparable to that of a simple latch. FIG. 4 is a schematic diagram of an illustrative embodiment of an implementation of an XOR-latch combination 400. This type of implementation is ideal for high-speed synchronous circuits, which cannot tolerate the delay that would be introduced by the presence of additional logic levels. This particular XOR-latch combination is a key element in high performance pseudo-random binary sequence generators (PRBS), phase detector circuits used for clock and data recovery (CDR) in communication circuits, bit error rate testers (BERT), and many other high-speed logic circuits. The circuit of FIG. 4 combines the XOR core of FIG. 3 with the clocking and holding circuitry of FIG. 2. Duplicate circuit elements are provided for the clocking feature as applied to four possible states that can result from two independent input values (e.g., A and B) in FIG. 4 as compared to two possible states that can result from a single independent input value (e.g., D) in FIG. 2.

Figure 5:
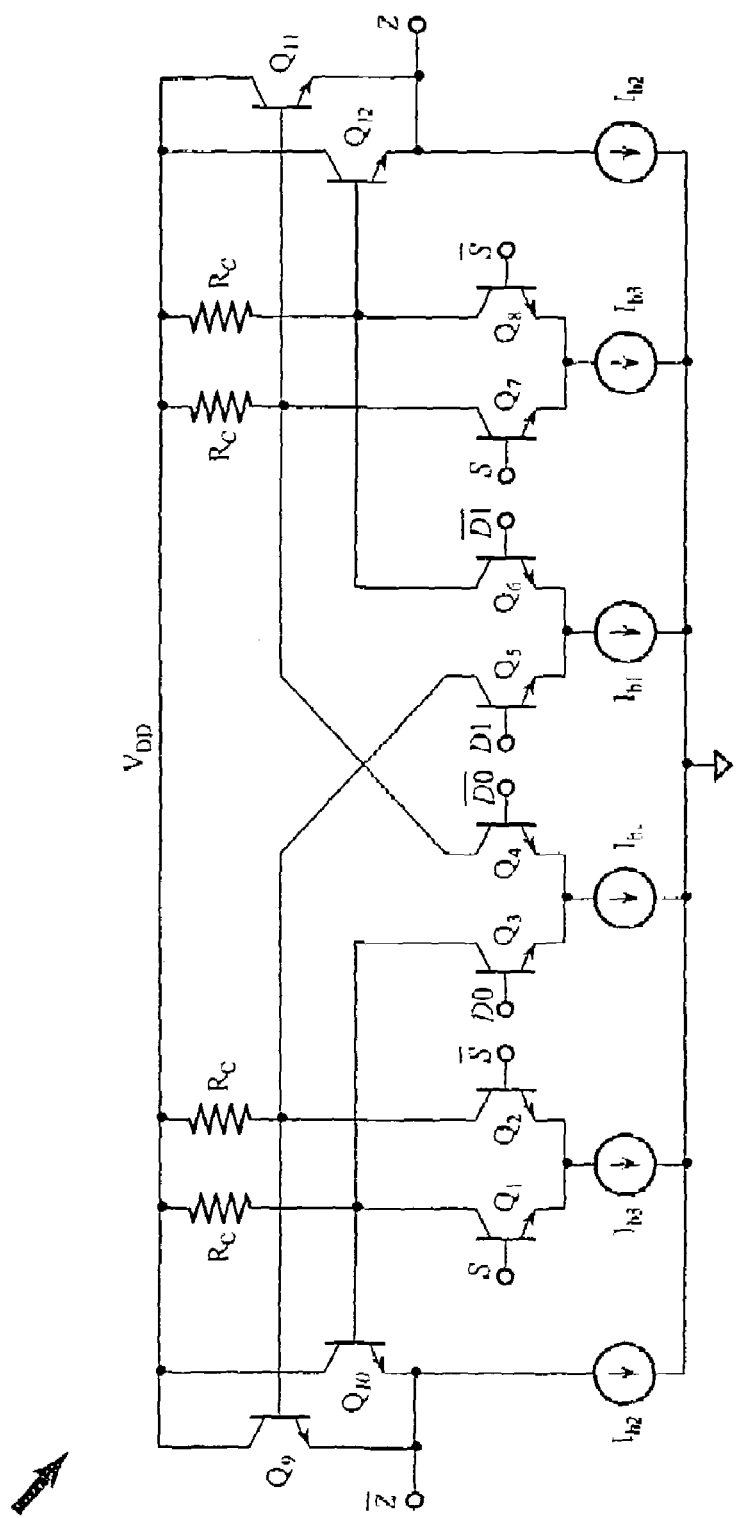
FIG. 5 is a schematic diagram that illustrates an exemplary embodiment of a multiplexer, according to principles of the invention.

FIG. 5 is a schematic diagram that illustrates an exemplary embodiment of a multiplexer 500. The overall topology resembles that of the XOR gate of FIG. 3. In this embodiment, inputs D0 and D1, select signal S, and output Z are differential. Differential pairs $Q_1$–$Q_2$ and $Q_7$–$Q_8$ are used to select inputs, and are controlled by the select signal S. They enable one device in $Q_9$–$Q_{10}$ pair and one in $Q_{11}$–$Q_{12}$ pair, and allow its associated input, either D0 or D1, to propagate to the output Z. In this embodiment, transistors $Q_1$–$Q_2$ and $Q_9$–$Q_{10}$ form an alternating pair of switched emitter followers. Also, transistors $Q_7$–$Q_8$ and $Q_{11}$–$Q_{12}$ form an alternating pair of switched emitter followers. Emitter followers $Q_9$–$Q_{10}$ and $Q_{11}$–$Q_{12}$ share bias currents $I_{b2}$, since only one device in each pair is turned on at any time. To assure that one of the emitter followers in each pair is fully turned off regardless of the input signals, the following current relationship should be maintained: $I_{b3} > I_{b1}$. The circuit in FIG. 5 is fully differential. However, as discussed hereinbelow, a simpler single-ended version is also possible with this topology.

Figure 5A:
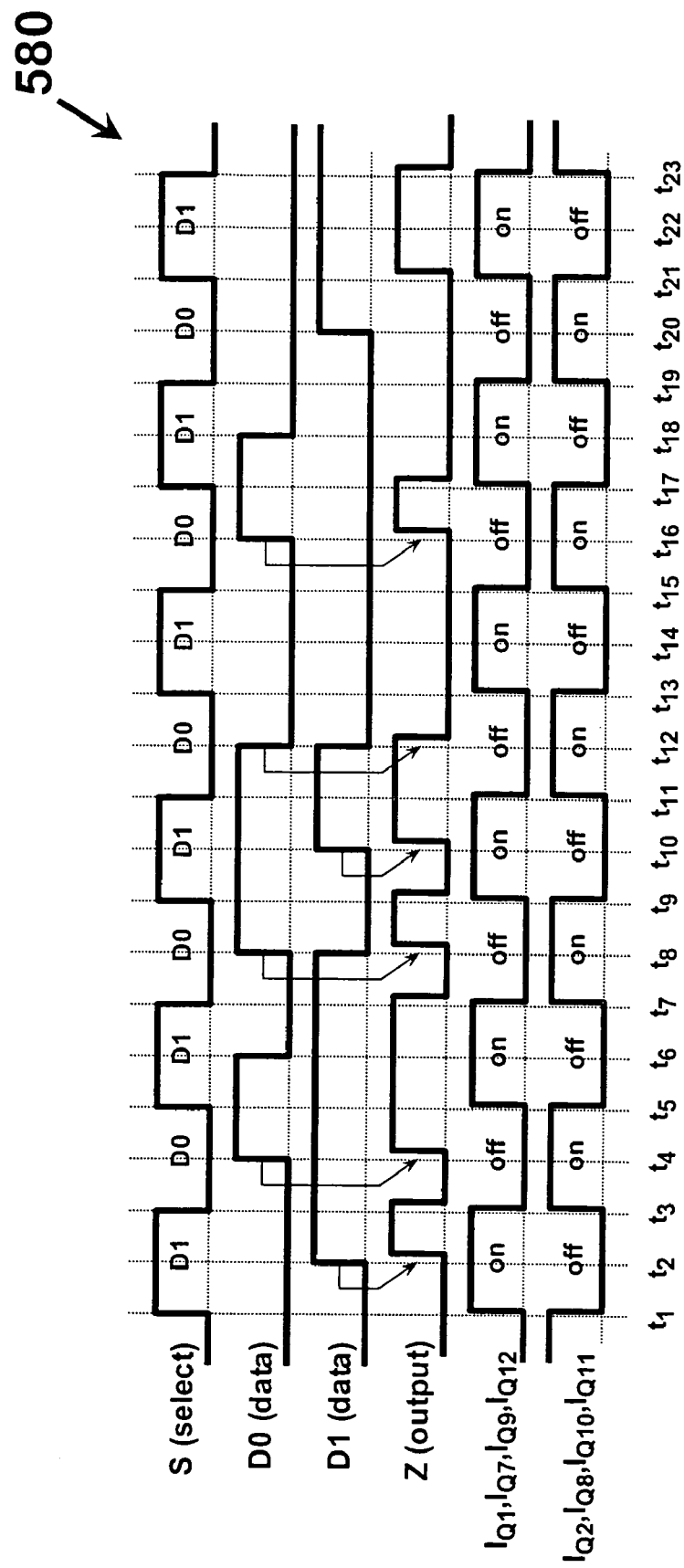
FIG. 5A is a timing diagram for the exemplary embodiment of the multiplexer of FIG. 5, according to principles of the invention.

FIG. 5A is a timing diagram 580 for the exemplary embodiment of the multiplexer of FIG. 5. The horizontal direction in timing diagram 580 represents time, and is marked in timing intervals, indicated by $t_1, t_2, t_3, \ldots t_{23}$. The vertical direction represents a plurality of signal states of various components, all referenced to the same time. In operation, the multiplexer circuit of FIG. 5 operates as follows hereinbelow. The signals shown are differential, but can also be thought of as non-inverted single-ended signals, where the inverted versions can be obtained using any of the inverters that are described with respect to FIGS. 7A and 7B. The following signals are shown in the timing diagram 580: S (input select), D0 (first input data stream), D1 (second input data stream), and Z (output data). $I_{Q1}$–$I_{Q12}$ are approximate currents flowing through the corresponding transistors, which provide some insight into circuit operation by indicating which transistors are "on" (conducting current) and which are "off" at any given time.

When S is low, D0 appears at the output Z, and when S is high, D1 appears at the output Z. This is by definition the function of a multiplexer; it provides a sequence of interleaved signals on a transmission line to be used by both signals in common. The multiplexer in FIG. 5 comprises two signal paths, which start with differential pairs $Q_3$–$Q_4$ and $Q_5$–$Q_6$. Only one path is enabled at any given time. The selection is accomplished with switched emitter followers comprising: (1) parallel emitter followers $Q_9$–$Q_{10}$ and $Q_{11}$–$Q_{12}$; (2) switching differential pairs $Q_1$–$Q_2$ and $Q_7$–$Q_8$; and (3) resistors $R_C$ used for switching the emitter followers by converting currents of $Q_1$–$Q_2$ and $Q_7$–$Q_8$ into voltages and pulling down the bases of emitter followers to disable them. These resistors also serve as loads for the differential pairs $Q_3$–$Q_4$ and $Q_5$–$Q_6$. Transistors $Q_1$, $Q_7$, $Q_9$, and $Q_{12}$ are all on, and transistors $Q_2$, $Q_8$, $Q_{10}$, and $Q_{11}$ are all off when D1 is selected. Transistors $Q_1$, $Q_7$, $Q_9$, and $Q_{12}$ are all off, and transistors $Q_2$, $Q_8$, $Q_{10}$, and $Q_{11}$ are all on when D0 is selected.

As seen in the timing diagram 580, when S0 is high in the interval $t_1$ to $t_3$, the signal representing D1 is selected and appears at the output Z, with a short propagation delay. An arrow from D1 to Z shows the correlation at time $t_2$. At time interval $t_3$–$t_5$, the signal representing D0 is selected and appears at the output Z, with a short propagation delay. An arrow from D0 to Z shows the correlation at time $t_4$. Similar correlations at $t_8$, $t_{12}$, and $t_{16}$ for D0 with Z and at $t_{10}$ for D1 with Z are also indicated. For example, Z goes high just after $t_{10}$ because D1 has gone high at $t_{10}$, and Z remains high after D0 is selected at $t_{11}$ because D0 also happens to be high. Z goes low at $t_{12}$ when selected D0 goes low, independent of what D1 does. At $t_{16}$, Z goes high because selected D0 goes high, and Z goes low at $t_{17}$ because selected D1 is low, even though D0 stays high.

Figure 6:
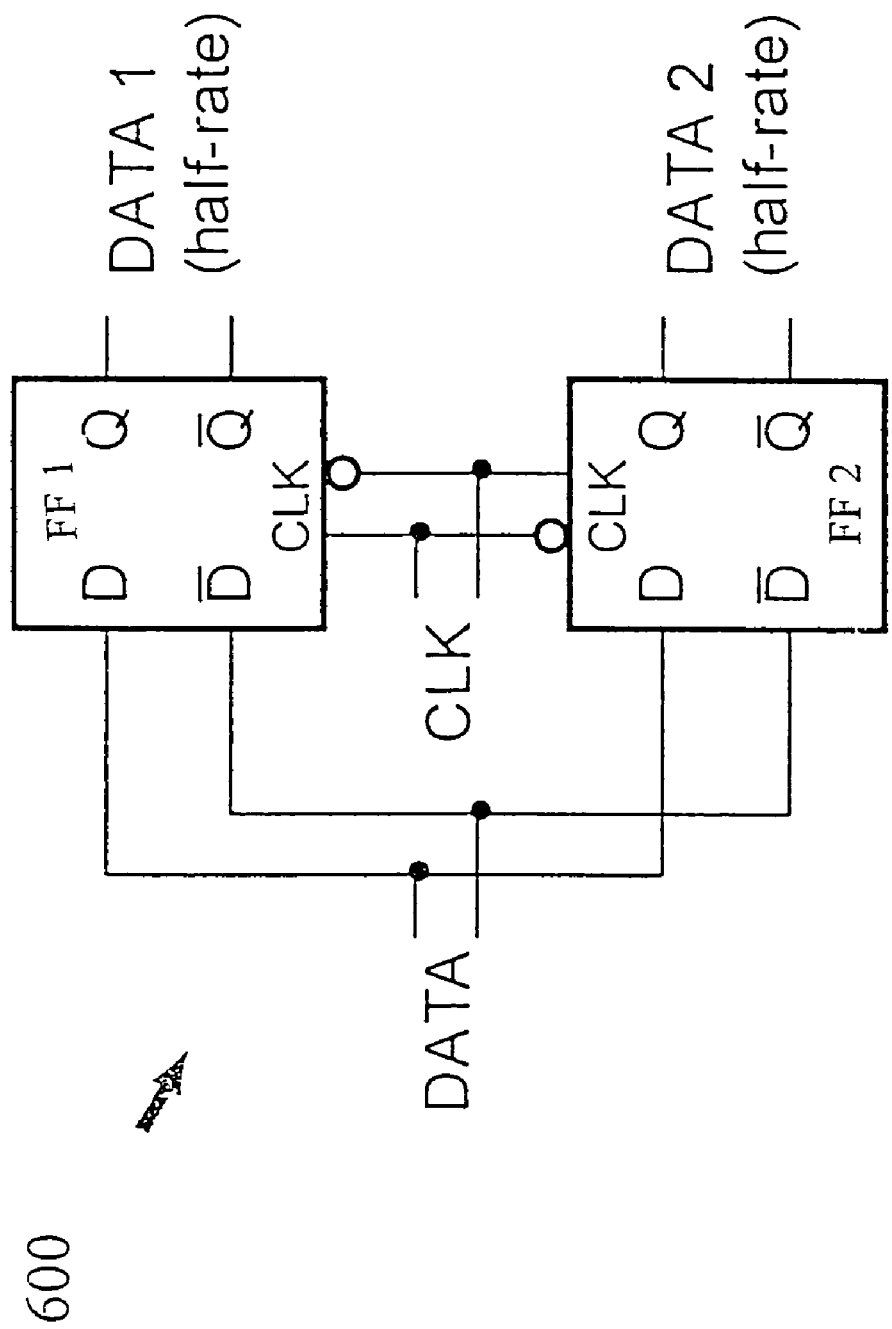
FIG. 6 is a schematic diagram that illustrates an exemplary embodiment of a demultiplexer, according to principles of the invention.

FIG. 6 is a schematic diagram that illustrates an exemplary embodiment of a demultiplexer 600. A DEMUX can be created using latches as basic building blocks. In the embodiment depicted in FIG. 6, a DEMUX capable of handling data in single bit units is described. The DEMUX comprises two flip-flops FF1, FF2. Data is applied to both flip flops simultaneously at a rate of 2R data units, for example, bits per second, from a data line that is represented by the differential pair of lines labeled DATA. In order to handle data comprising more than one bit, for example bytes (e.g., 8 bits, or 9 bits with a redundancy bit), one can provide a plurality of parallel data lines and a plurality of DEMUX stages, each DEMUX stage handling one of the plurality of data lines. Alternatively, one can operate in serial data communication. A clock signal is provided by the differential lines labeled CLK, at a rate R pulses per second (e.g., 2R half pulses per second). Because FF1 and FF2 are clocked in an out-of-phase relationship, as shown in FIG. 6 by the asymmetric clock lines CLK, having an inverter at each flip flop in antiphase relationship, only one flip flop latches data on any half clock cycle. The latch flip flop holds its data for a full clock cycle, during which time the other flip flop latches a second data state. Thus, the two flip flops each provide a data stream at a rate R units per second (e.g., half the input data rate), the stream from each flip flop representing every second data unit of the input data stream. Thus the output stream DATA1 from FF1 represents, for example, every data bit having ordinal number 2n+1 of the input data stream, while the output stream DATA2 from FF1 represents, for example, every data bit having ordinal number 2n of the input data stream, where n runs through all integers, beginning with n=0. The input data stream is therefore split into two separated data streams. Each FF is constructed from two simple latches, such as shown in FIG. 2.

The schematics in FIG. 2 through FIG. 6 in the embodiments presented employ BJT devices, but these circuits can be implemented using FETs, or any other type of transistor. In some embodiment, a circuit according to principles of the invention can be implemented with a single ended input, as described herein below. In some embodiments, current sources can be replaced with resistors to reduce voltage headroom requirement. Furthermore, the technique can be employed in circuitry where the potential difference across the circuit is provided by one reference voltage of $V_1$ volts, and a second reference voltage of $V_2$ volts, neither of which is ground potential, but where the voltage difference between $V_1$ and $V_2$ is sufficient to operate the circuit of interest. Many equivalents or variants of the circuits presented as examples herein will become apparent to those of ordinary skill in the circuit arts.

Figure 7A:
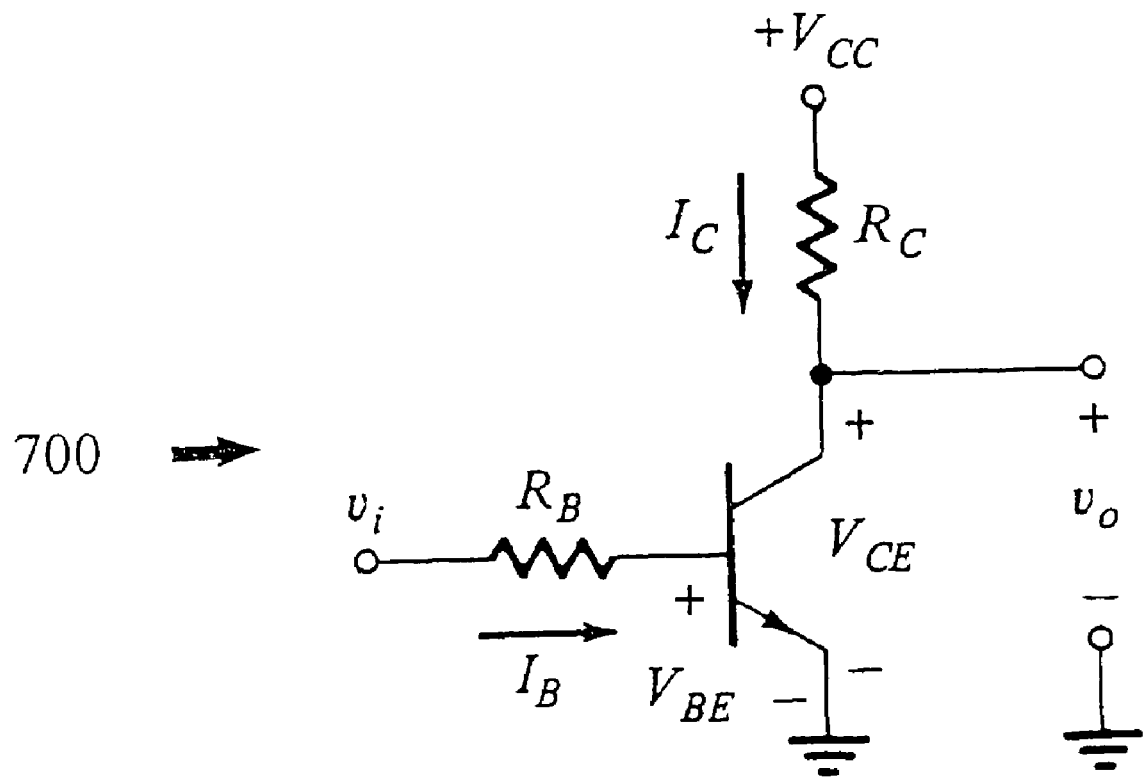
FIGS. 7A and 7B are circuit diagrams of prior art inverters that can be used to convert a differential input into a single ended input.
Figure 7B:
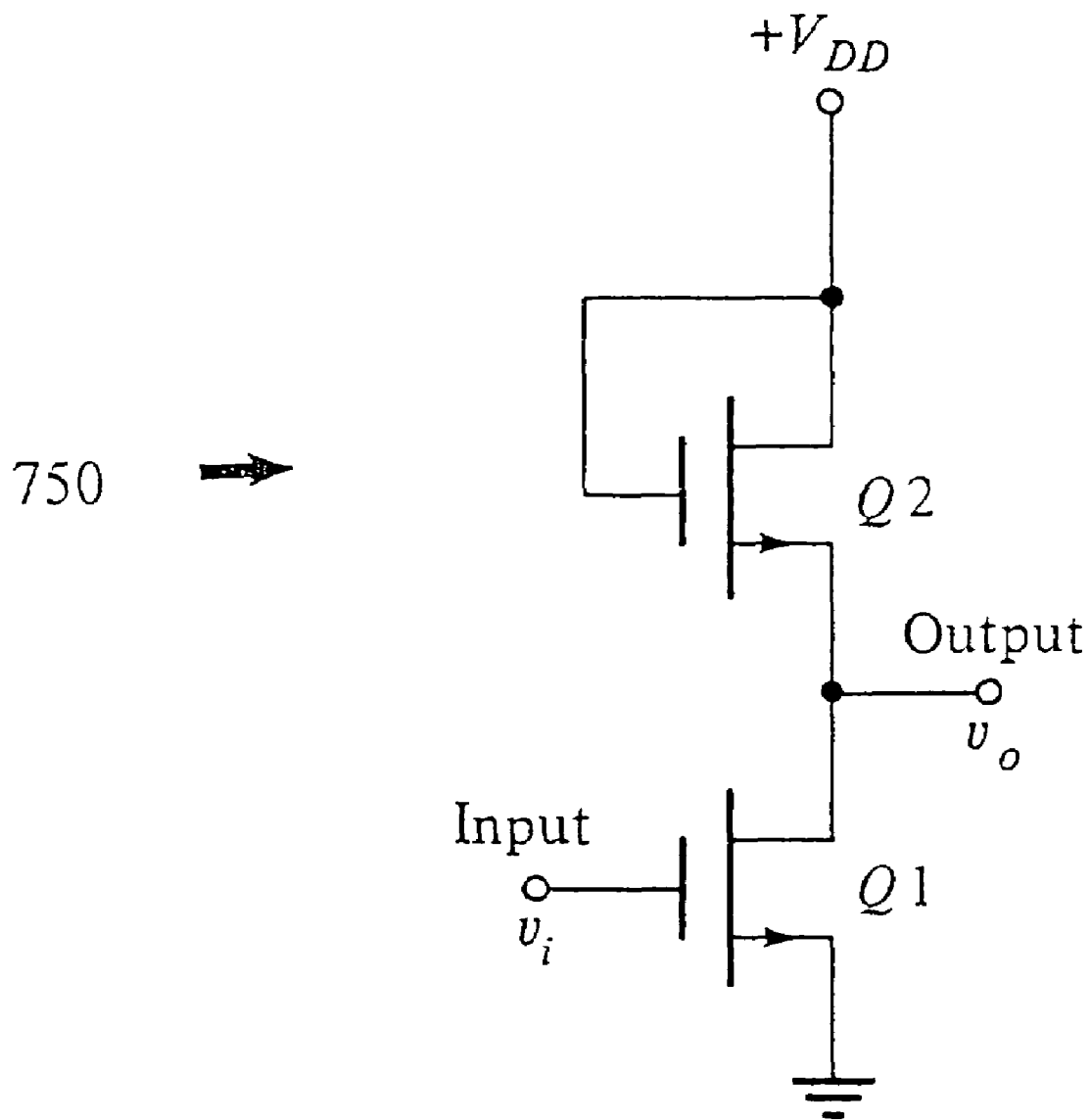

FIGS. 7A and 7B are circuit diagrams of prior art inverters that can be used to convert a differential input into a single ended input. FIG. 7A is a schematic diagram that illustrates a simple BJT inverter circuit 700 that is described in Millman and Grabel, *Microelectronics*, ($2^{nd}$ Edition, McGraw-Hill, Inc, New York, 1987), at pages 241–243, the entire disclosure of which pages is incorporated herein by reference. FIG. 7B is a schematic diagram that illustrates a simple MOSFET inverter circuit 750 that is described in Millman and Grabel at pages 226–232, the entire disclosure of which pages is incorporated herein by reference. In brief, each inverter has an input terminal that receives an input signal having a voltage $v_i$ and an output terminal that provides an output signal having a voltage $v_o$, both voltages referenced to a common reference voltage such as ground. As is well known in the circuit arts, an inverter is a circuit that satisfies the logical relationship, expressed for a binary system having two states 0 and 1 (for example on-off, or high-low), that the output takes the state 1 if and only if the input does not take the state 1. In practice, inverter gates have finite delays (related to the switching time of the active elements therein), so the output signal takes an inverted state that is well defined relative to the input after the delay period. In the circuits described herein that embody principles of the invention, it is possible in another embodiment to additionally provide an inverter stage that takes its input signal from the direct input of any of the differential input gates described hereinabove, and provides its output signal to the one or more corresponding inverted input gate of the circuit, thereby allowing operation of the circuit using a single ended input. For example, in FIG. 2, one can add an inverter stage having an input terminal in electrical communication with input terminal D and an output terminal in electrical communication with input terminal bar D so as to permit the so-modified circuit of FIG. 2 to operate using a single input signal.

Circuits embodying the principles of the invention have been reduced to practice using commercially available BiCMOS technology. For example, test circuits according to each of the circuits shown in FIGS. 2, 3 and 4 have been fabricated using SiGe (silicon-germanium) materials and the 7HP process. These fabrication materials and technologies are well known to those in the integrated circuit arts, and will not be explained herein in detail. For additional information, the reader can see, for example, the web page htt://www-306.ibm.com/chips/techlib/techlib.nsf/products/BiCMOS__7HP. IBM states on that page that "BiCMOS 7HP is a 0.18-µm technology that incorporates a high-performance SiGe bipolar device optimized for high-speed or low-power applications. It is ideally suited to applications in the 40- to 100-GHz frequency space, such as fiber-optic communication transceivers and automotive proximity sensors." Additional documents are available by download from that web page, including a document entitled "Foundry Technologies 180-nm CMOS, RF CMOS and SiGe BiCMOS." Another source of information is the web page http://www.mosis.org/products/fab/vendors/ibm/7hp/. The MOSIS page states that "MOSIS is offering access to the IBM 0.18 micron SiGe BiCMOS 7HP technology for prototype and low volume fabrication." The manufacturing technology used is not per se a critical detail in employing aspects of the invention, and circuits embodying principles of the invention can be fabricated using many different methods, including possibly connecting discrete devices in suitable topological configurations. However, if circuits embodying aspects of the invention are fabricated using materials of construction having different electronic bandgaps than the materials reported herein, the reference voltage differences that can be used for operating the circuits will be changed in ways that are at least somewhat predictable. It is to be remembered that the intention is to provide a two level circuit that operates at lower supply voltages than a corresponding circuit having a three level topology, independent of the material from which the circuit is fabricated. If the same circuit were to be made as a first example and a second example using different materials having different electronic bandgaps, the different first and second circuits would yield different working voltages, all other things being equal.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein.

While the present invention has been explained with reference to the structure disclosed herein, it is not confined to the details set forth and this invention is intended to cover any modifications and changes as may come within the scope and spirit of the following claims.

What is claimed is:

1. A low voltage active circuit logic device, comprising:
a first level comprising at least three current sources, said current sources having a first terminal in electrical communication with a first reference voltage, and a second terminal;
a second level comprising at least three pairs of active circuit elements configured to steer current of said current sources through a selected member of said pair of active circuit elements, each member of said pairs of active circuit elements having a first terminal as a signal input terminal, each member of said pair of active circuit elements having a second terminal in electrical communication with a selected one of said second terminal of said current sources, each member of said pair of active circuit elements having a third terminal as an output terminal; and
at least two output subcircuit each configured to provide an output logic signal represented by a voltage, each of said output subcircuits having at least one signal input terminal and at least one signal output terminal, each of said at least one signal input terminal in electrical communication with a selected one of said third terminals of said members of a selected pair of active circuit elements of said second level to receive at one of said output subcircuit signal input terminals a signal comprising a steered current provided by one of said members of said pairs of active circuit elements of said second level, and each of said output subcircuits having a third terminal in electrical communication with a second reference voltage;
wherein at least two of said at least three pairs of active circuit elements of said second level are configured to co-operate to control electrical signal flow from a selected one of said signal input terminals of at least one of said at least three pairs of active circuit elements of said second level to a respective signal output terminal of a selected one of said at least two output subcircuits according to one of two states:
transmitting said signal from said selected one of said signal input terminals of at least one of said at least three pairs of active circuit elements of said second level to a respective signal output terminal of a selected one of said at least two output subcircuits, and disconnecting said signal from said selected one of said signal input terminals of at least one of said at least three pairs of active circuit elements of said second level from a respective signal output terminal of a selected one of said at least two output subcircuits; and at least one memory element in electrical communication with said signal output terminals of said at least two output subcircuits, said memory element configured to maintain a state of a signal provided at said signal output terminals of said at least two output subcircuits when said co-operating pairs of active circuit elements of said second level disconnect said signal from said signal input terminals of at least one of said pairs of active circuit elements of said second level to said signal output terminals of said at least two output subcircuits.

2. The low voltage active circuit logic device according to claim 1, wherein said low voltage active circuit logic device is configured to operate at a reduced reference voltage difference relative to a logic gate fabricated in the same electronic material according to a conventional three level CML topology and providing the same functionality.

3. The low voltage active circuit logic device according to claim 1, wherein said reference voltage difference represents a difference between said first reference voltage and said second reference voltage.

4. The low voltage active circuit logic device according to claim 3, wherein said reference voltage difference is less than 3.3 volts.

5. The low voltage active circuit, logic device according to claim 1 configured as a latch.

6. The low voltage active circuit logic device according to claim 1 configured as a synchronous logic gate.

7. The synchronous logic gate according to claim 6 implementing at least one of a Boolean function selected from an AND, a NAND, an OR, a NOR, an XOR, an XNOR and any combinations thereof.

8. The low voltage active circuit logic device according to claim 1, wherein said active circuit elements of said second level comprise differential pairs.

9. The low voltage active circuit logic device according to claim 1, wherein at least one of the said pairs of active circuit elements of said second level and at least one of said output subcircuits are configured to operate as switched emitter followers or switched source followers.

10. The low voltage active circuit logic device according to claim 1, wherein said memory element comprises a cross coupled pair of active circuit elements or a differential pair.

11. The low voltage active circuit logic device according to claim 10, wherein said memory element includes a level shifting circuit.

12. The low voltage active circuit logic device according to claim 1, wherein said memory element comprises a capacitor.

13. The low voltage active circuit logic device according to claim 12, wherein said memory element includes a level shifting circuit.

14. The low voltage active circuit logic device according to claim 1, wherein said memory element includes a level shifting circuit.

15. The low voltage active circuit logic device according to claim 1, in combination with a circuit element such that the combination is configured as a low voltage active circuit logic device with a single-ended input.

16. The low voltage active circuit logic device according to claim 15, wherein said circuit element is an inverter.

* * * * *